United States Patent
Chuang et al.

(10) Patent No.: US 12,112,985 B2
(45) Date of Patent: Oct. 8, 2024

(54) SEMICONDUCTOR SUBSTRATE (71) Applicant: GlobalWafers Co., Ltd., Hsinchu (TW)

(72) Inventors: Chih-Yuan Chuang, Hsinchu (TW); Walter Tony Wohlmuth, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 18/520,518

(22) Filed: Nov. 27, 2023

(65) Prior Publication Data

US 2024/0105512 A1 Mar. 28, 2024

Related U.S. Application Data (62) Division of application No. 17/458,564, filed on Aug. 27, 2021, now Pat. No. 11,887,893.

(30) Foreign Application Priority Data

Oct. 6, 2020 (TW) ................................. 109134514

(51) Int. Cl.
*H01L 29/34* (2006.01)
*H01L 21/02* (2006.01)
(Continued)

(52) U.S. Cl.
CPC .... *H01L 21/7806* (2013.01); *H01L 21/02447* (2013.01); *H01L 21/02529* (2013.01);
(Continued)

(58) Field of Classification Search
CPC ........... H01L 21/7806; H01L 21/02447; H01L 21/02529; H01L 21/0254; H01L 21/76254; H01L 29/045; H01L 29/1608; H01L 29/2003; H01L 29/267; H01L 21/185; H01L 21/02433; H01L 21/0245; H01L 21/02502; H01L 21/02664; H01L 21/26506; H01L 21/02002; H01L 21/268;
(Continued)

(56) References Cited

U.S. PATENT DOCUMENTS

2006/0037530 A1* 2/2006 Dwilinski ................. C30B 7/00
117/70
2008/0156254 A1* 7/2008 Dwilinski .............. B82Y 20/00
117/1
(Continued)

*Primary Examiner* — Samuel Park
(74) *Attorney, Agent, or Firm* — JCIPRNET (57) ABSTRACT A semiconductor substrate includes a high-resistivity silicon carbide layer and a gallium nitride epitaxial layer. The gallium nitride epitaxial layer is formed on a surface, a thickness of the gallium nitride epitaxial layer is less than 2 μm, and a full width at half maximum (FWHM) of an X-ray diffraction analysis (002) plane is less than 100 arcsec. The thickness of the high-resistivity silicon carbide layer ranges from 20 μm to 50 μm. The surface of the high-resistivity silicon carbide layer has an angle ranging from 0° to +/−8° with respect to a (0001) plane. The micropipe density (MPD) of the high-resistivity silicon carbide layer is less than 0.5 ea/cm², the basal plane dislocation (BPD) of the high-resistivity silicon carbide layer is less than 10 ea/cm², and the threading screw dislocation (TSD) of the high-resistivity silicon carbide layer is less than 500 ea/cm².

13 Claims, 12 Drawing Sheets (51) Int. Cl.
  *H01L 21/762* (2006.01)
  *H01L 21/78* (2006.01)
  *H01L 29/04* (2006.01)
  *H01L 29/16* (2006.01)
  *H01L 29/20* (2006.01)
  *H01L 29/267* (2006.01)

(52) U.S. Cl.
  CPC .... *H01L 21/0254* (2013.01); *H01L 21/76254* (2013.01); *H01L 29/045* (2013.01); *H01L 29/1608* (2013.01); *H01L 29/2003* (2013.01); *H01L 29/267* (2013.01)

(58) Field of Classification Search
  CPC ........... H01L 21/7813; H01L 21/02378; H01L 21/0262
  See application file for complete search history.

(56) References Cited

U.S. PATENT DOCUMENTS

| | | | | |
|---|---|---|---|---|
| 2013/0280466 | A1* | 10/2013 | Zwieback | B28D 5/00 428/64.1 |
| 2014/0070234 | A1* | 3/2014 | Loboda | H01L 21/02447 257/77 |
| 2017/0321345 | A1* | 11/2017 | Xu | C30B 29/36 |
| 2018/0290893 | A1* | 10/2018 | Dukes | C30B 29/36 |
| 2020/0286730 | A1* | 9/2020 | Moder | H01L 29/8611 |

* cited by examiner

SEMICONDUCTOR SUBSTRATE

CROSS-REFERENCE TO RELATED APPLICATION

This application is a divisional application of and claims the priority benefit of U.S. patent application Ser. No. 17/458,564, filed on Aug. 27, 2021. The prior U.S. patent application Ser. No. 17/458,564 claims the priority benefit of Taiwan application serial no. 109134514, filed on Oct. 6, 2020. The entirety of each of the above-mentioned patent applications is hereby incorporated by reference herein and made part of this specification.

BACKGROUND

Technology Field

The disclosure relates to a semiconductor manufacturing technology, and particularly to a semiconductor substrate.

Description of Related Art

Epitaxy refers to the technology of growing new crystals on a wafer to form a semiconductor layer. Films formed by the epitaxial process have the advantages of high purity and good thickness control, so the films have been widely used in the manufacture of radio frequency (RF) components or power devices.

Originally, an epitaxial substrate is a silicon substrate on which gallium nitride is grown. However, it is discovered that silicon and gallium nitride have a problem of lattice mismatch. Recently, silicon carbide substrates have been replaced by silicon substrates to solve the problem of lattice mismatch.

However, the cost of the silicon carbide substrate is significantly higher than the cost of the silicon substrate, so it is not easy to strike the balance between the cost and the epitaxial quality.

SUMMARY

The disclosure provides a semiconductor substrate adapted for radio frequency (RF) components and having good crystal quality.

The disclosure provides another semiconductor substrate adapted for power devices and having good crystal quality.

A semiconductor substrate of the disclosure includes a high-resistivity silicon carbide layer and a gallium nitride epitaxial layer. The high-resistivity silicon carbide layer includes a first surface and a second surface opposite to the first surface. The gallium nitride epitaxial layer is formed on the second surface of the high-resistivity silicon carbide layer, a thickness of the gallium nitride epitaxial layer is less than 2 μm, and a full width at half maximum (FWHM) of an X-ray diffraction analysis (002) plane is less than 100 arcsec. The thickness of the high-resistivity silicon carbide layer ranges from 20 μm to 50 μm, the second surface of the high-resistivity silicon carbide layer has an angle ranging from 0° to +/−8° with respect to a (0001) plane, a micropipe density (MPD) of the high-resistivity silicon carbide layer is less than 0.5 ea/cm$^2$, basal plane dislocation (BPD) of the high-resistivity silicon carbide layer is less than 10 ea/cm$^2$, and threading screw dislocation (TSD) of the high-resistivity silicon carbide layer is less than 500 ea/cm$^2$.

In an embodiment of the disclosure, the resistance of the high-resistivity silicon carbide layer is greater than 1E5 ohm-cm.

In an embodiment of the disclosure, the resistance variation rate of the high-resistivity silicon carbide layer is less than 50%.

In an embodiment of the disclosure, the semiconductor substrate further includes a buffer layer, which is in direct contact with the first surface of the high-resistivity silicon carbide layer.

In an embodiment of the disclosure, the thickness of the buffer layer is less than 1.5 μm.

In an embodiment of the disclosure, the semiconductor substrate further includes a laser lift off (LLO) layer, which is in direct contact with the first surface of the high-resistivity silicon carbide layer.

In an embodiment of the disclosure, the laser lift off (LLO) layer is silicon carbide doped with aluminum.

In an embodiment of the disclosure, the doping concentration of aluminum of the laser lift off (LLO) layer is greater than 1E20 cm', and the thickness of the laser lift off (LLO) layer ranges from 1.0 nm to 10 nm.

In an embodiment of the disclosure, the semiconductor substrate further includes a supporting substrate bonded to an exposed surface of a material layer, wherein the supporting substrate comprises a silicon substrate, a silicon-on-insulator (SOI) substrate, a ceramic substrate, or a glass substrate.

Another semiconductor substrate includes an N-type silicon carbide (N—SiC) layer; and a gallium nitride epitaxial layer. The gallium nitride epitaxial layer is formed on a surface of the N-type silicon carbide (N—SiC) layer, the thickness of the gallium nitride epitaxial layer ranges from 0.3 μm to 6 μm, and a full width at half maximum (FWHM) of an X-ray diffraction analysis (002) plane is less than 100 arcsec. The thickness of the N-type silicon carbide (N—SiC) layer ranges from 0.1 μm to 50 μm, and the surface of the N-type silicon carbide (N—SiC) layer comprises an angle ranging from 0° to +/−8° with respect to a (0001) plane. A micropipe density (MPD) of the N-type silicon carbide (N—SiC) layer is less than 0.5 ea/cm$^2$, basal plane dislocation (BPD) of the N-type silicon carbide (N—SiC) layer is less than 10 ea/cm$^2$, and threading screw dislocation (TSD) of the N-type silicon carbide (N—SiC) layer is less than 500 ea/cm$^2$.

In another embodiment of the disclosure, the resistance of the N-type silicon carbide (N—SiC) layer ranges from 1E15 cm$^{-3}$ to 1E20 cm$^{-3}$.

In another embodiment of the disclosure, the resistance variation rate of the N-type silicon carbide (N—SiC) layer is less than 5%.

In another embodiment of the disclosure, the semiconductor substrate further includes a supporting substrate bonded to an exposed surface of the N-type silicon carbide (N—SiC) layer. The supporting substrate includes a silicon substrate, a silicon-on-insulator (SOI) substrate, a ceramic substrate, or a glass substrate.

Based on the above, the semiconductor substrate of the disclosure has good crystallinity, and the cost can be saved by reusing the silicon carbide substrate.

In order to make the above-mentioned features and advantages of the disclosure more comprehensible, the following specific embodiments are described in detail in conjunction with the accompanying drawings.

DESCRIPTION OF THE EMBODIMENTS

The exemplary embodiments of the disclosure will be fully described below with reference to the drawings, but the disclosure may also be implemented in many different forms and should not be construed as being limited to the embodiments described herein. In the drawings, for the sake of clarity, the size and thickness of each region, location, and layer may not be drawn to actual scale. To facilitate understanding, the same elements in the following description will be described with the same symbols.

FIG. 1A to FIG. 1E are schematic cross-sectional views of manufacturing a semiconductor substrate according to a first embodiment of the disclosure.

Figure 1A:
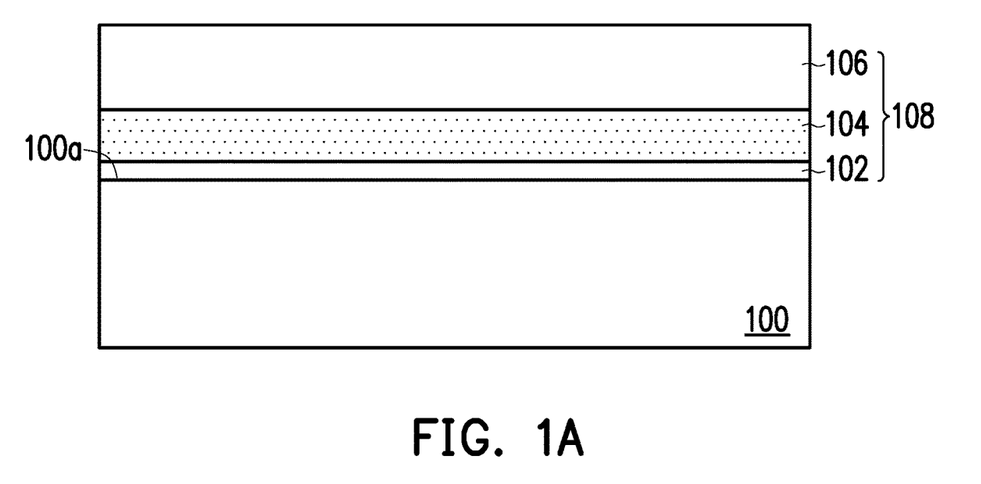
FIG. 1A to FIG. 1E are schematic cross-sectional views of manufacturing a semiconductor substrate according to a first embodiment of the disclosure.

Referring to FIG. 1A, a buffer layer 102 and a silicon carbide layer 104 are epitaxially grown on a silicon surface 100a of an N-type silicon carbide substrate 100. The thickness of the N-type silicon carbide substrate 100 ranges from 300 μm to 725 μm, for example. The angle of the silicon surface 100a of the N-type silicon carbide substrate 100 with respect to the (0001) surface ranges from 0° to +/−8°, such as from 0° to +/−5°, preferably from 0° to +/−3°, and 0° the best. The micropipe density (MPD) of the N-type silicon carbide substrate 100 is less than 1 ea/cm$^2$, the basal plane dislocation (BPD) of the N-type silicon carbide substrate 100 is less than 3000 ea/cm$^2$, and the threading screw dislocation (TSD) of the N-type silicon carbide substrate 100 is less than 1000 ea/cm$^2$. The resistance of the N-type silicon carbide substrate 100 ranges approximately from 15 mohm-cm to 26 mohm-cm. The buffer layer 102 is silicon carbide with low resistance and with a single crystal structure. The silicon carbide layer 104 is high-resistivity silicon carbide or N-type silicon carbide (N—SiC). The silicon carbide layer 104 of a high-resistivity silicon carbide (e.g., semi-insulating silicon carbide) is adapted for semiconductor substrates with radio frequency (RF) components. On the other hand, the silicon carbide layer 104 of an N-type silicon carbide is adapted for semiconductor substrates with power devices. The thickness of the silicon carbide layer 104 can be set between 0.1 μm and 50 μm. Moreover, the surface of the silicon carbide layer 104 has an angle ranging from 0° to +/−8°, an angle ranging from 0° to +/−5°, or an angle ranging from 0° to +/−3° with respect to the (0001) plane, for example, the micropipe density (MPD) of the silicon carbide layer 104 can be less than 0.5 ea/cm$^2$, the basal plane dislocation (BPD) of the silicon carbide layer 104 can be less than 10 ea/cm$^2$, and the threading screw dislocation (TSD) of the silicon carbide layer 104 can be less than 500 ea/cm$^2$. In one embodiment, the resistance of the silicon carbide layer 104 of high-resistivity silicon carbide is greater than 1E5 ohm-cm, for example. In another embodiment, the resistance of the silicon carbide layer 104 of N-type silicon carbide (N—SiC) ranges from 1E15 cm' to 1E20 cm', for example. Next, a gallium nitride epitaxial layer 106 is epitaxially grown on the silicon carbide layer 104 to obtain a semiconductor structure 108 composed of the buffer layer 102, the silicon carbide layer 104, and the gallium nitride epitaxial layer 106.

Figure 1B:
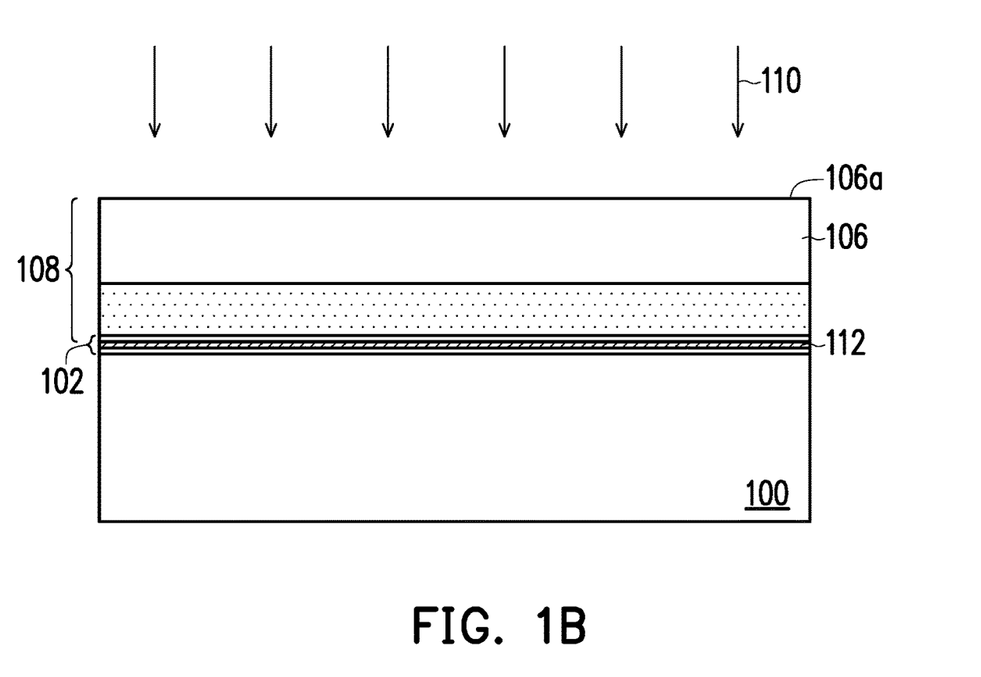

Next, referring to FIG. 1B, after the gallium nitride epitaxial layer 106 is epitaxially grown, a laser 110 is used to form a damaged layer 112 in the semiconductor structure 108. In the embodiment, the laser 110 is applied to the buffer layer 102 from a surface 106a of the gallium nitride epitaxial layer 106 to form the damaged layer 112 in the buffer layer 102.

Figure 1C:
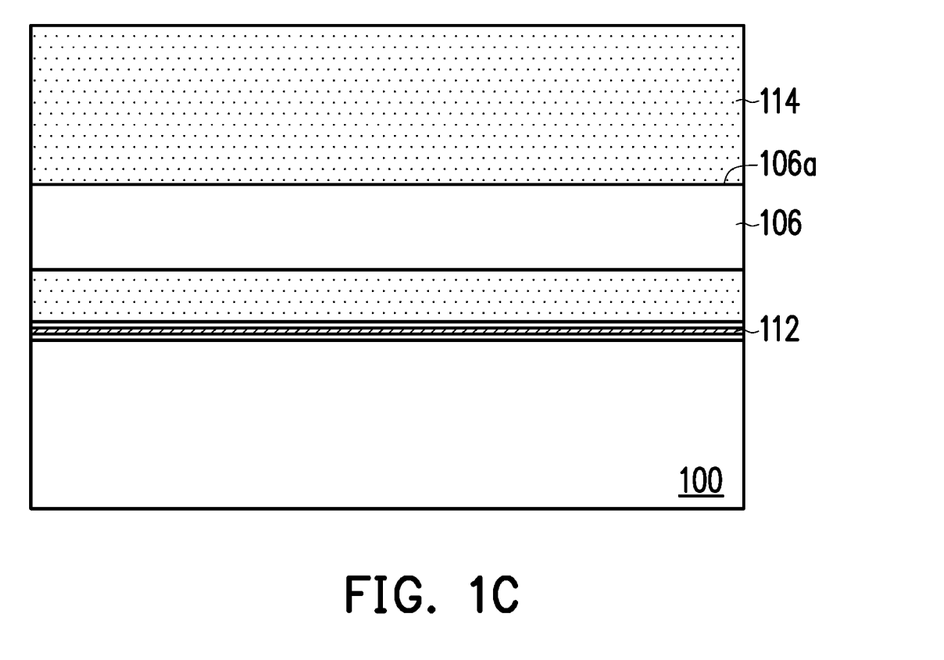

Next, referring to FIG. 1C, a chip carrier 114 is bonded to the surface 106a of the gallium nitride epitaxial layer 106, and the material of the chip carrier 114 includes glass or sapphire.

Figure 1D:
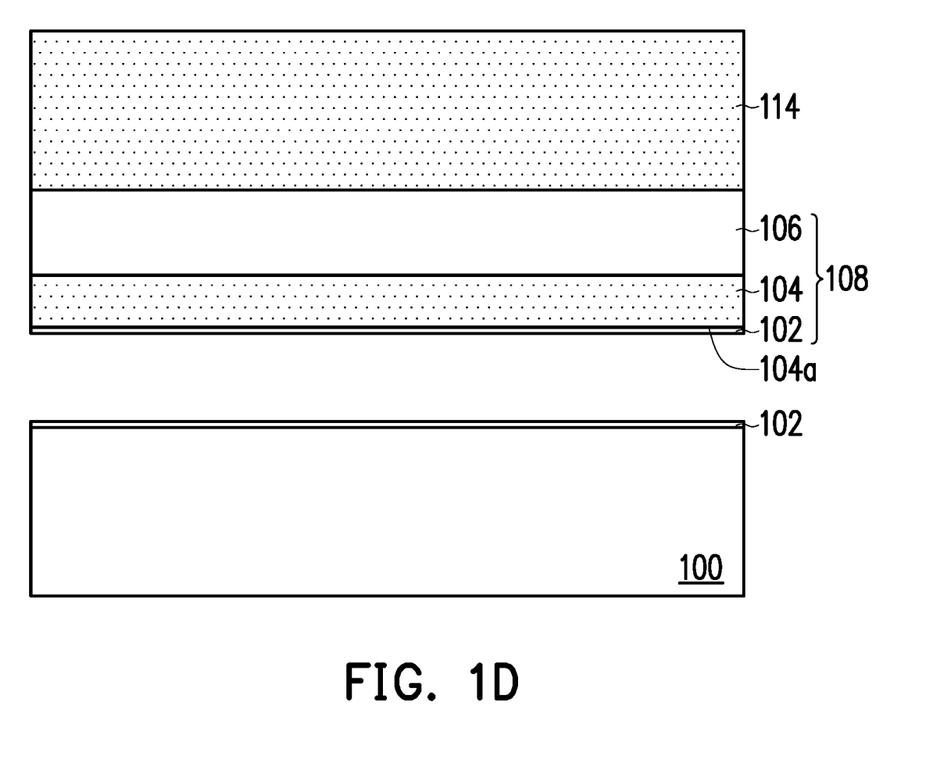

Subsequently, referring to FIG. 1D, the N-type silicon carbide substrate 100 and the semiconductor structure 108 are separated at the location of the damaged layer (112), and part of the buffer layer 102 may be left on the carbon surface 104a of the silicon carbide layer 104. Therefore, in one embodiment, the buffer layer 102 can be left. In another embodiment, the buffer layer 102 requires abrasion.

Figure 1E:
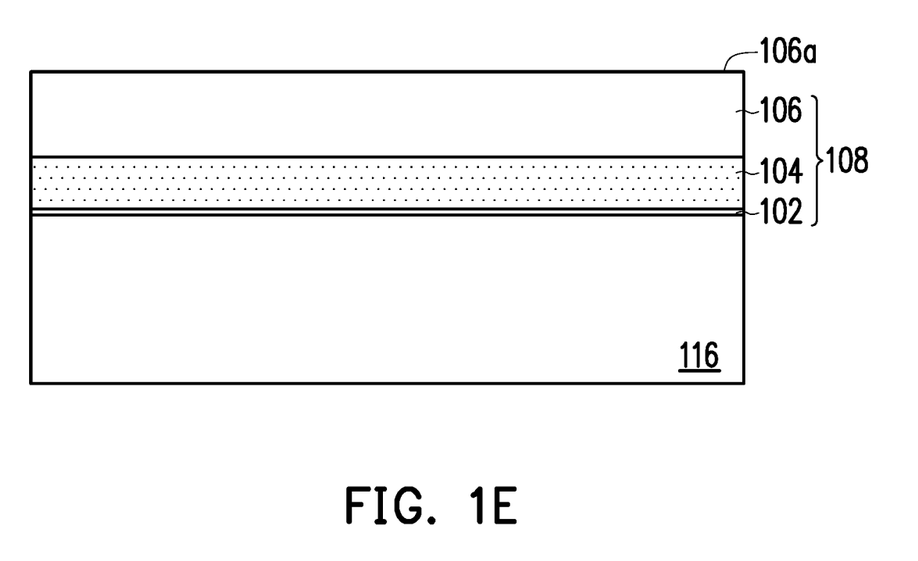

Next, referring to FIG. 1E, in response to subsequent requirements, a supporting substrate 116 can be optionally bonded to the surface of the buffer layer 102 to facilitate subsequent movement and fixation of the entire semiconductor substrate. The supporting substrate 116 is a silicon substrate, a silicon-on-insulator (SOI) substrate, a ceramic substrate, or a glass substrate, for example. On the other hand, if the buffer layer has been abraded, the supporting substrate 116 can be bonded to the surface of the silicon carbide layer 104. Moreover, after the supporting substrate 116 is bonded, the chip carrier (114) may be removed to form a radio frequency component or a power component from the exposed surface 106a of the gallium nitride epitaxial layer 106.

In the manufacturing process of the first embodiment, the laser 110 is used to form the damaged layer 112 for separation in the buffer layer 102 after the gallium nitride epitaxial layer 106 is grown, so not only the crystallinity quality of the silicon carbide layer 104 and the gallium nitride epitaxial layer 106 can be guaranteed, but also the complete silicon carbide layer 104 and the N-type silicon carbide substrate 100 can be retained. Therefore, the separated N-type silicon carbide substrate 100 can be reused, and the material cost is greatly reduced.

FIG. 2A to FIG. 2D are schematic cross-sectional views of manufacturing a semiconductor substrate according to a second embodiment of the disclosure. The same or similar components are illustrated by the same numeral reference numbers as those in the first embodiment. Refer to the relevant description of the first embodiment for the description of the same or similar components, which is not iterated herein.

Figure 2A:
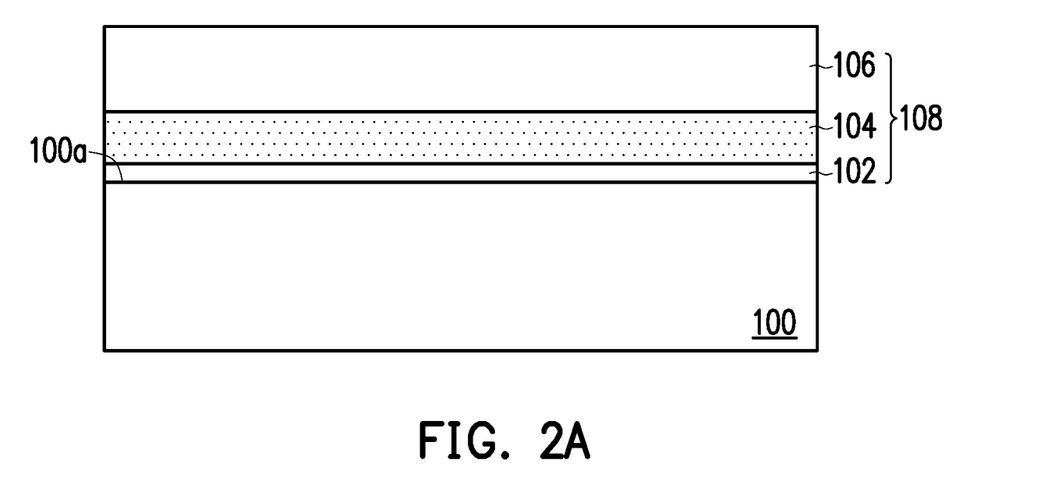
FIG. 2A to FIG. 2D are schematic cross-sectional views of manufacturing a semiconductor substrate according to a second embodiment of the disclosure.

Referring to FIG. 2A, a buffer layer 102 and a silicon carbide layer 104 are epitaxially grown on the silicon surface 100a of an N-type silicon carbide substrate 100, and next a gallium nitride epitaxial layer 106 is epitaxially grown on the silicon carbide layer 104 to obtain a semiconductor structure 108 composed of the buffer layer 102, the silicon carbide layer 104, and the gallium nitride epitaxial layer 106.

Figure 2B:
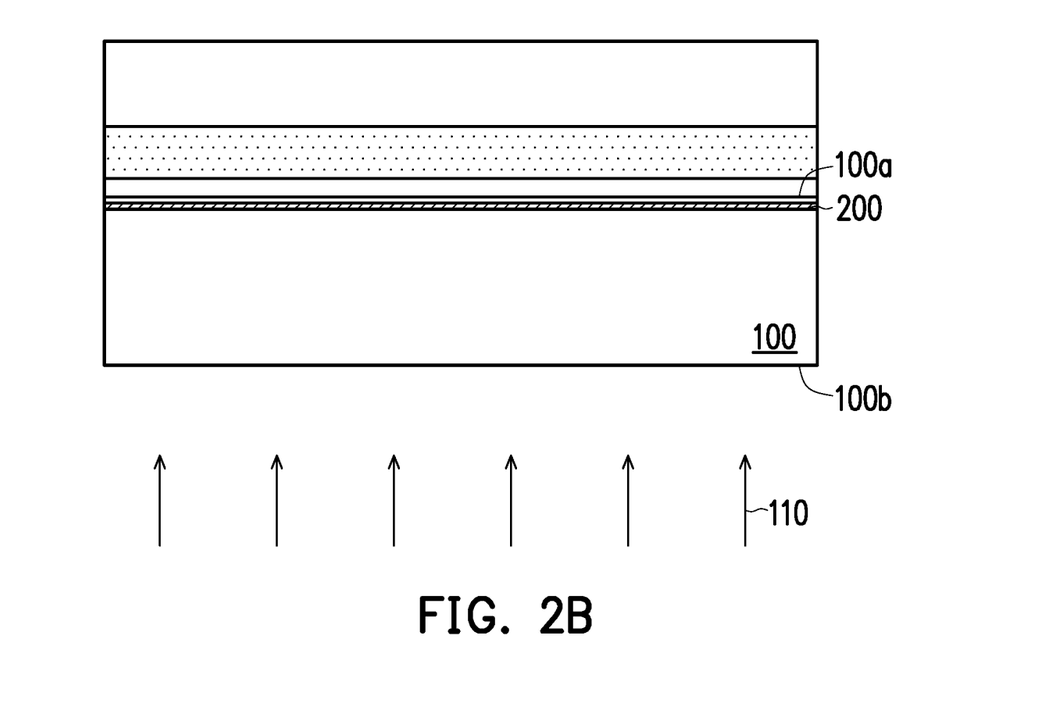

Next, referring to FIG. 2B, in the embodiment, a laser is applied from the carbon surface 100b of the N-type silicon carbide substrate 100 to the silicon surface 100a of the N-type silicon carbide substrate 100 to form the damaged layer 200 in the N-type silicon carbide substrate 100.

Figure 2C:
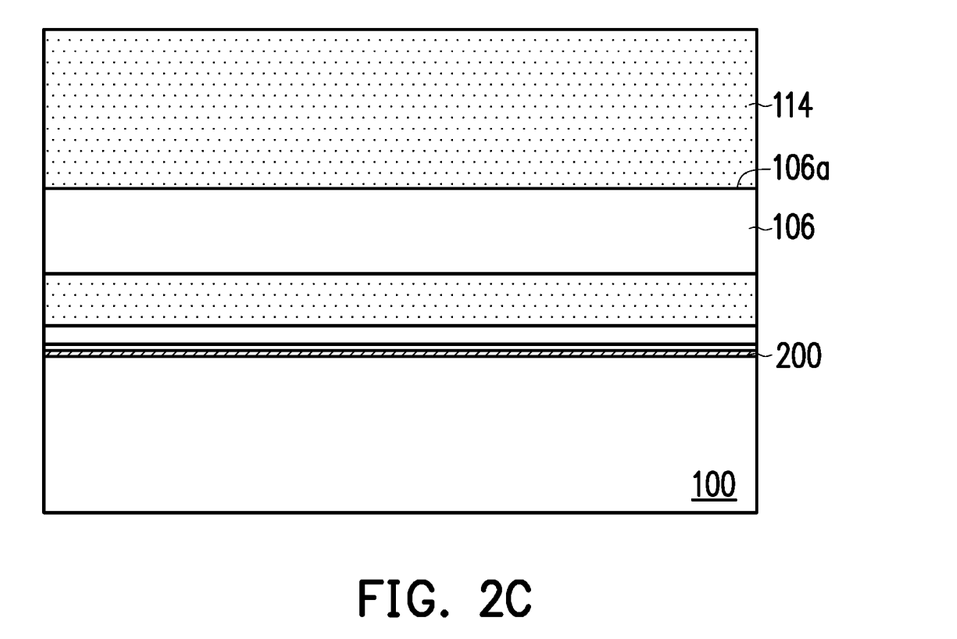

Then, referring to FIG. 2C, a chip carrier 114 is bonded to the surface 106a of the gallium nitride epitaxial layer 106.

Figure 2D:
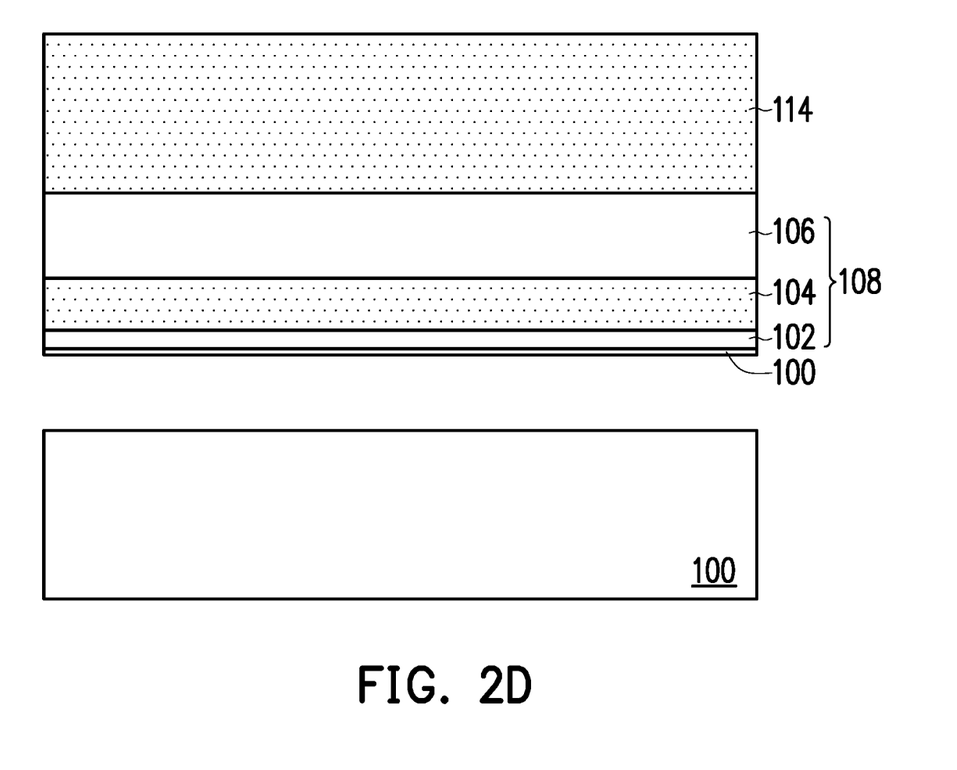

Subsequently, referring to FIG. 2D, the N-type silicon carbide substrate 100 and the semiconductor structure 108 are separated at the location of the damaged layer (200), and part of the N-type silicon carbide substrate 100 may be left on the buffer layer 102. Therefore, in one embodiment, the buffer layer 102 can be retained. In another embodiment, abrasion is required to remove the left N-type silicon carbide substrate 100 and the left buffer layer 102. Moreover, if necessary, the steps shown in FIG. 1E may be performed, that is, the step of bonding a supporting substrate (not shown) and the step of removing the chip carrier 114.

In the manufacturing process of the second embodiment, the laser 110 is used to form the damaged layer 200 for separation in the N-type silicon carbide substrate 100 after the gallium nitride epitaxial layer 106 is grown, so not only the crystallinity quality of the silicon carbide layer 104 and the gallium nitride epitaxial layer 106 can be guaranteed, but also the complete silicon carbide layer 104 is retained. Moreover, since the laser 110 can control the precise location where the damaged layer 200 is formed, a majority of the N-type silicon carbide substrate 100 can be retained as much as possible, the separated N-type silicon carbide substrate 100 can be reused, and the material cost is greatly reduced.

FIG. 3A to FIG. 3D are schematic cross-sectional views of manufacturing a semiconductor substrate according to a third embodiment of the disclosure. The same or similar components are illustrated by the same numeral reference numbers as those in the first embodiment. Refer to the relevant description of the first embodiment for the description of the same or similar components, which is not iterated herein.

Figure 3A:
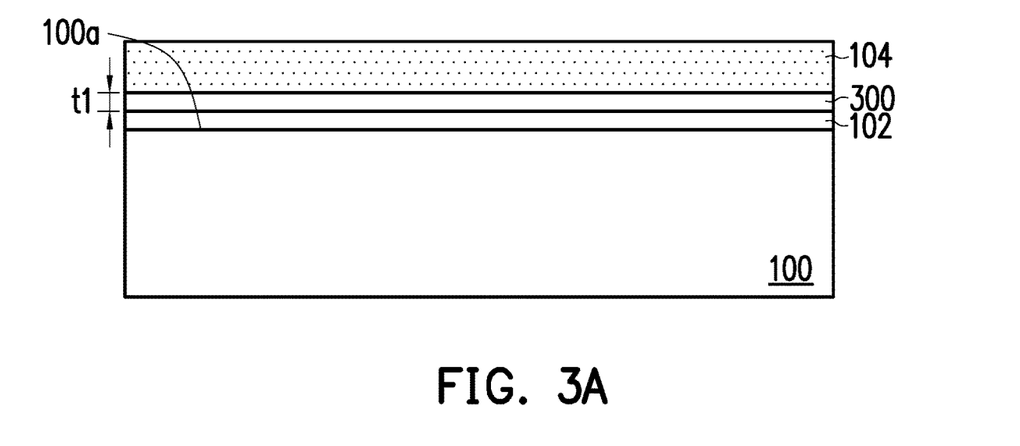
FIG. 3A to FIG. 3D are schematic cross-sectional views of manufacturing a semiconductor substrate according to a third embodiment of the disclosure.

Referring to FIG. 3A, a buffer layer 102 is epitaxially grown on the silicon surface 100a of an N-type silicon carbide substrate 100, and then a laser lift off (LLO) layer 300 is epitaxially grown. The LLO layer 300 is silicon carbide doped with aluminum, the doping concentration of aluminum of the LLO layer 300 is above 1E20 cm$^{-3}$, for example, and the thickness t1 of the LLO layer 300 ranges from 1.0 nm to 10 nm, for example. Then, a silicon carbide layer 104 is epitaxially grown on the LLO layer 300.

Figure 3B:
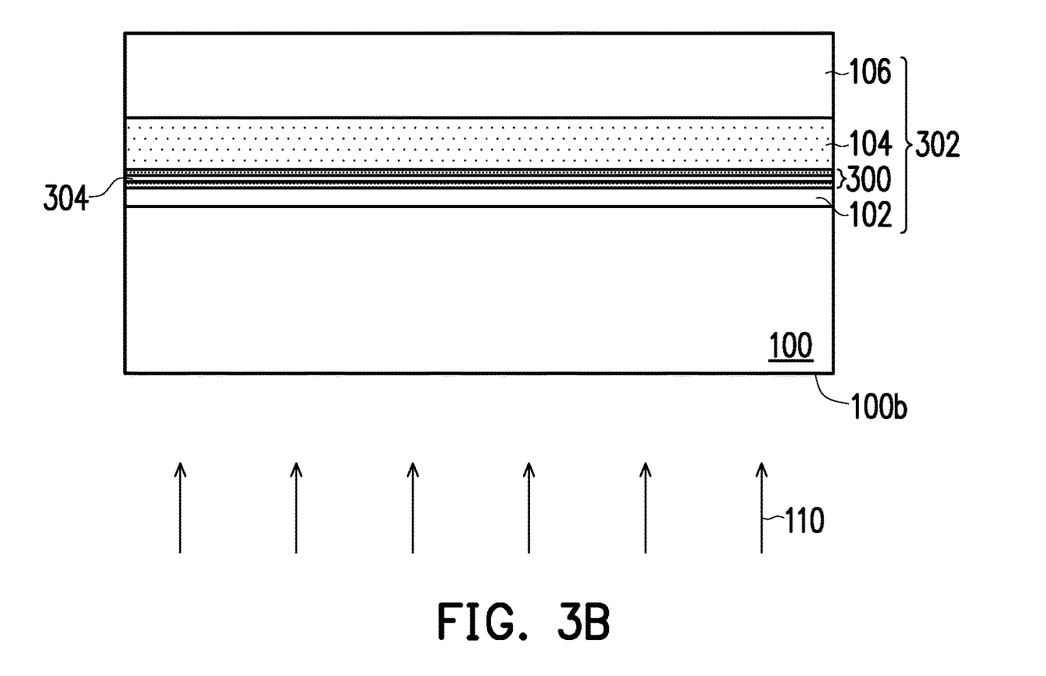

Next, referring to FIG. 3B, a gallium nitride epitaxial layer 106 is epitaxially grown on the silicon carbide layer 104 to obtain a semiconductor structure 302 composed of the buffer layer 102, the LLO layer 300, the silicon carbide layer 104, and the gallium nitride epitaxial layer 106. Then, a laser 110 is applied to the LLO layer 300 from the carbon surface 100b of the N-type silicon carbide substrate 100 to form a damaged layer 304 in the LLO layer 300.

Figure 3C:
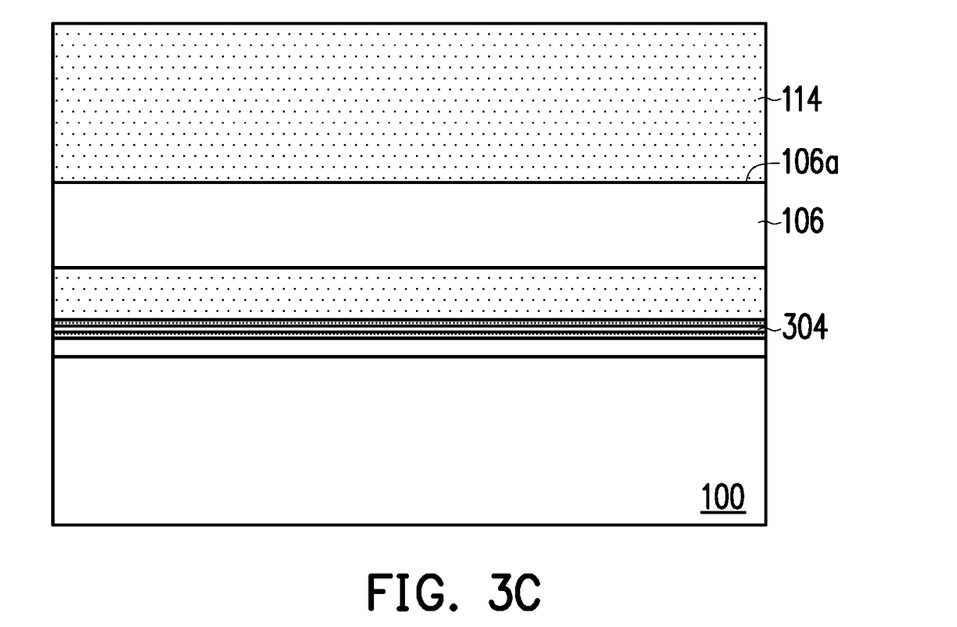

Then, referring to FIG. 3C, a chip carrier 114 is bonded to the surface 106a of the gallium nitride epitaxial layer 106.

Figure 3D:
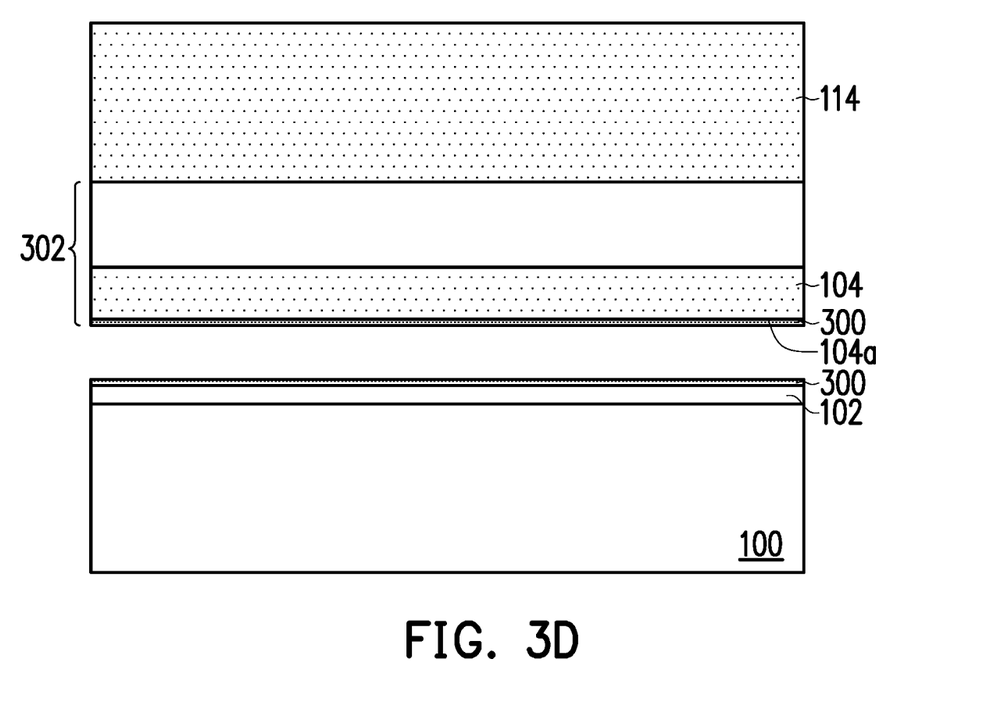

Subsequently, referring to FIG. 3D, the N-type silicon carbide substrate 100 and the semiconductor structure 302 are separated at the location of the damaged layer (304), and part of the LLO layer 300 may be left on the carbon surface 104a of the silicon carbide layer 104. Therefore, in one embodiment, the LLO layer 300 can be retained. In another embodiment, abrasion is required to remove the left LLO layer 300. Moreover, if necessary, the steps shown in FIG. 1E may be performed, that is, the step of bonding a supporting substrate (not shown) and the step of removing the chip carrier 114.

In the manufacturing process of the third embodiment, the laser 110 is used to form the damaged layer 304 for separation in the LLO layer 300 after the gallium nitride epitaxial layer 106 is grown, so not only the crystallinity quality of the silicon carbide layer 104 and the gallium nitride epitaxial layer 106 is guaranteed, but also the complete silicon carbide layer 104 and the N-type silicon carbide substrate 100 are retained. Therefore, the separated N-type silicon carbide substrate 100 can be reused, and the material cost is greatly reduced. Moreover, the resistance of the LLO layer 300 is less than that of the buffer layer 102, so the problem of lattice mismatch between the silicon carbide layer 104 and the underlying structure layer can be further improved.

FIG. 4A to FIG. 4D are schematic cross-sectional views of manufacturing a semiconductor substrate according to a fourth embodiment of the disclosure. The same or similar components are illustrated by the same numeral reference numbers as those in the first embodiment. Refer to the relevant description of the first embodiment for the description of the same or similar components, which is not iterated herein.

Figure 4A:
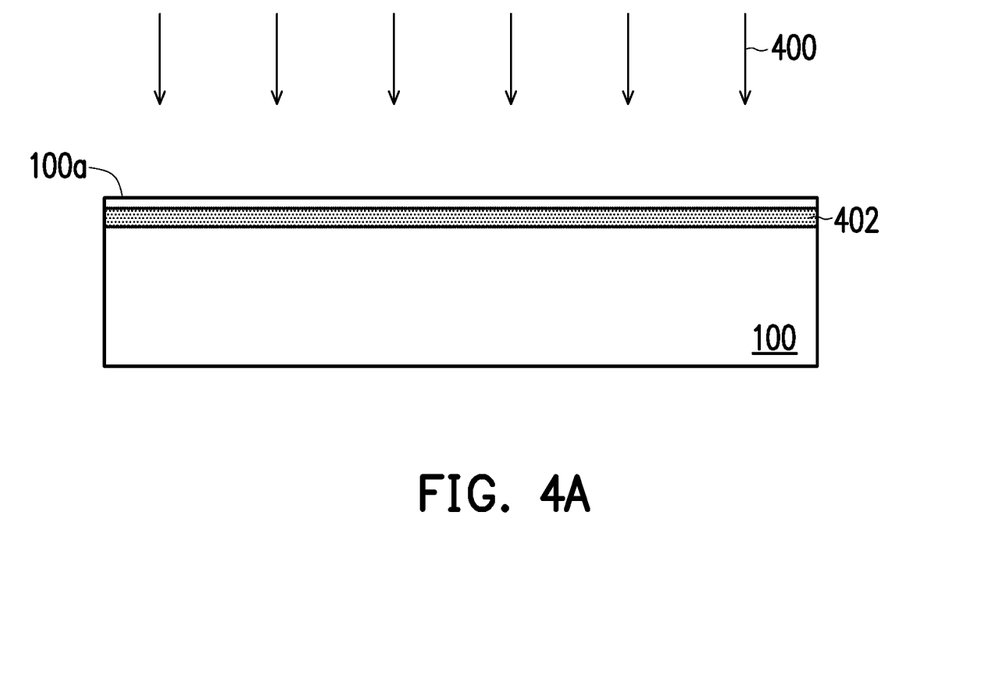
FIG. 4A to FIG. 4D are schematic cross-sectional views of manufacturing a semiconductor substrate according to a fourth embodiment of the disclosure.

Referring to FIG. 4A, ion implantation 400 is used to form a damaged layer 402 in the silicon surface 100a of an N-type silicon carbide substrate 100. Therefore, the damaged layer 402 is the ion implantation area in the N-type silicon carbide substrate 100.

Figure 4B:
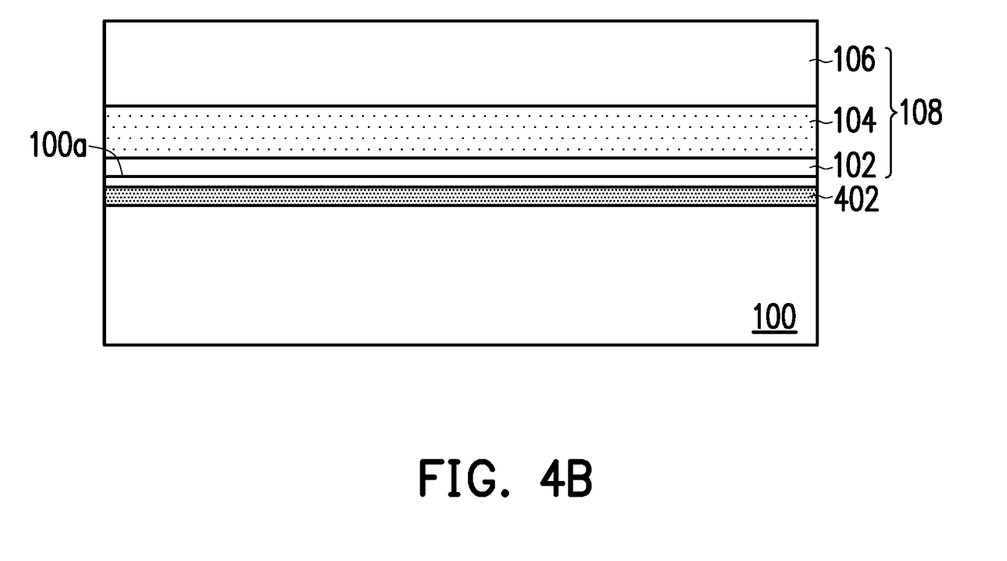

Then, referring to FIG. 4B, a buffer layer 102, a silicon carbide layer 104, and a gallium nitride epitaxial layer 106 are epitaxially grown on the silicon surface 100a of the N-type silicon carbide substrate 100, so a semiconductor structure 108 composed of the buffer layer 102, the silicon carbide layer 104, and the gallium nitride epitaxial layer 106 is obtained.

Figure 4C:
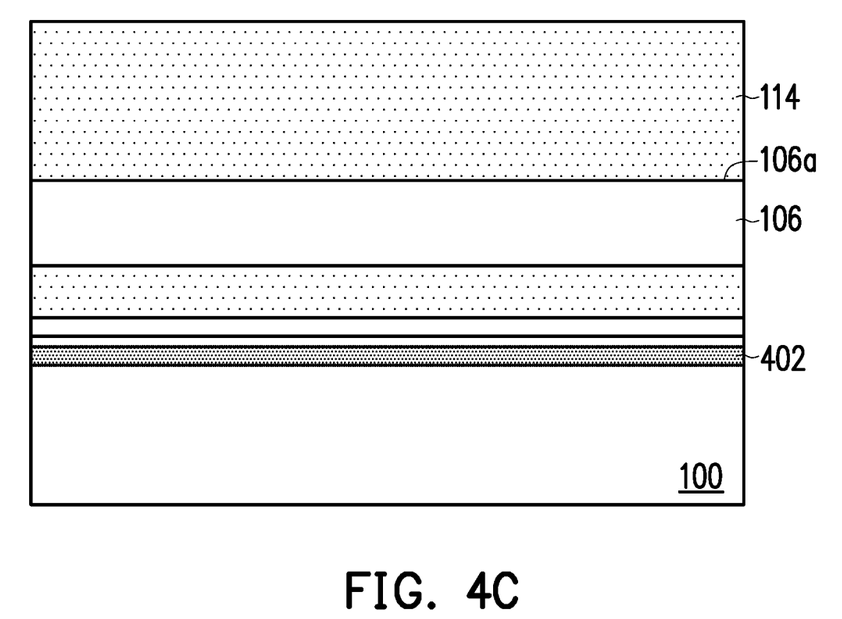

Subsequently, referring to FIG. 4C, a chip carrier 114 is bonded to the surface 106a of the gallium nitride epitaxial layer 106.

Figure 4D:
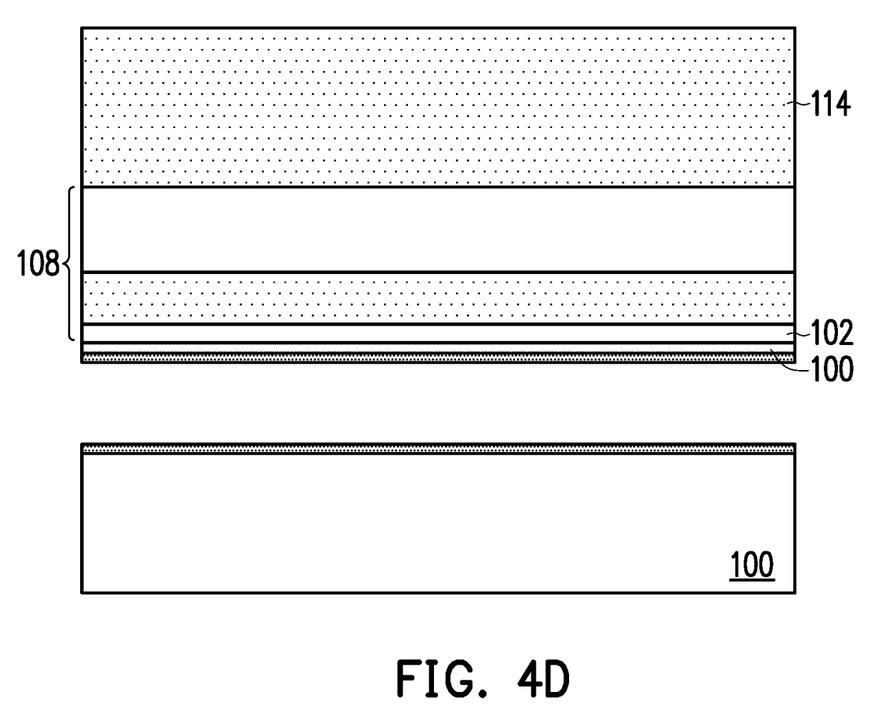

Then, referring to FIG. 4D, the N-type silicon carbide substrate 100 and the semiconductor structure 108 are separated at the location of the damaged layer 402, and part of the N-type silicon carbide substrate 100 may be left on the buffer layer 102. Therefore, in one embodiment, part of the N-type silicon carbide substrate 100 and the buffer layer 102 may be retained. In another embodiment, abrasion is required to remove the left N-type silicon carbide substrate 100 and the left buffer layer 102. Moreover, if necessary, the steps shown in FIG. 1E may be performed, that is, the step of bonding a supporting substrate (not shown) and the step of removing the chip carrier 114.

In the manufacturing process of the fourth embodiment, the ion implantation 400 is used to form the damaged layer 402 for separation in the N-type silicon carbide substrate 100 before the gallium nitride epitaxial layer 106 is grown, so not only the crystallinity quality of the silicon carbide layer 104 and the gallium nitride epitaxial layer 106 can be guaranteed, but also the separated N-type silicon carbide substrate 100 can be reused, and the material cost is greatly reduced.

Figure 5A:
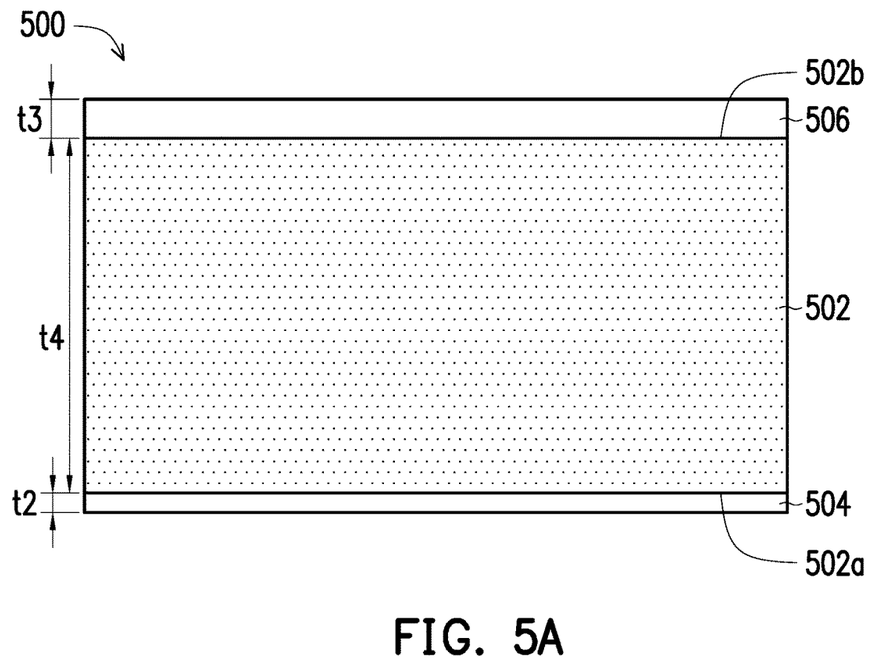
FIG. 5A is a schematic cross-sectional view of a semiconductor substrate according to a fifth embodiment of the disclosure.

FIG. 5A is a schematic cross-sectional view of a semiconductor substrate according to a fifth embodiment of the disclosure.

Referring to FIG. 5A, a semiconductor substrate 500 of the embodiment includes a high-resistivity silicon carbide layer 502, a material layer 504, and a gallium nitride epitaxial layer 506, which accordingly is adapted for semiconductor substrates with radio frequency (RF) components. The high-resistivity silicon carbide layer 502 has a first surface 502a and a second surface 502b. The first surface 502a is opposite to the second surface 502b, and the high-resistivity silicon carbide layer 502 is semi-insulating silicon carbide (SI—SiC), for example. The material layer 504 is in direct contact with the first surface 502a of the high-resistivity silicon carbide layer 502, but the disclosure is not limited thereto. In another embodiment, the semiconductor substrate may not have the material layer 504. The material layer 504 is a buffer layer, for example, and the thickness t2 of the buffer layer may be less than 1.5 µm. In one embodiment, the buffer layer is a single crystal structure and is silicon carbide having less resistance than that of the high-resistivity silicon carbide layer 502. The gallium nitride epitaxial layer 506 is formed on the second surface 502b of the high-resistivity silicon carbide layer 502, and the thickness t3 of the gallium nitride epitaxial layer 506 is less than 2 µm. Moreover, the structure of FIG. 5A can be manufactured with any method in the first embodiment to the fourth embodiment, and a step of removing left structures other than the material layer 504 can be added as required. After testing the obtained gallium nitride epitaxial layer 506, it is shown that the full width at half maximum (FWHM) of the X-ray diffraction analysis (002) plane can be less than 100 arcsec, and therefore the grown epitaxial film is verified to be of excellent quality.

In FIG. 5A, the thickness t4 of the high-resistivity silicon carbide layer 502 ranges from 20 µm to 50 µm, and the second surface 502b of the high-resistivity silicon carbide layer 502 has an angle ranging from 0° to +/−8° with respect to the (0001) plane, such as from 0° to +/−5°, and preferably from 0° to +/−3°. The micropipe density (MPD) of the high-resistivity silicon carbide layer 502 is less than 0.5 ea/cm$^2$, the basal plane dislocation (BPD) of the high-resistivity silicon carbide layer 502 is less than 10 ea/cm$^2$, and the threading screw dislocation (TSD) of the high-resistivity silicon carbide layer 502 is less than 500 ea/cm$^2$. The resistance of the high-resistivity silicon carbide layer 502 is greater than 1E5 ohm-cm. The resistance variation rate of the high-resistivity silicon carbide layer 502 is less than 50%, for example. The so-called "resistance variation rate" refers to the result of dividing the resistance standard deviation by the resistance average value.

Figure 5B:
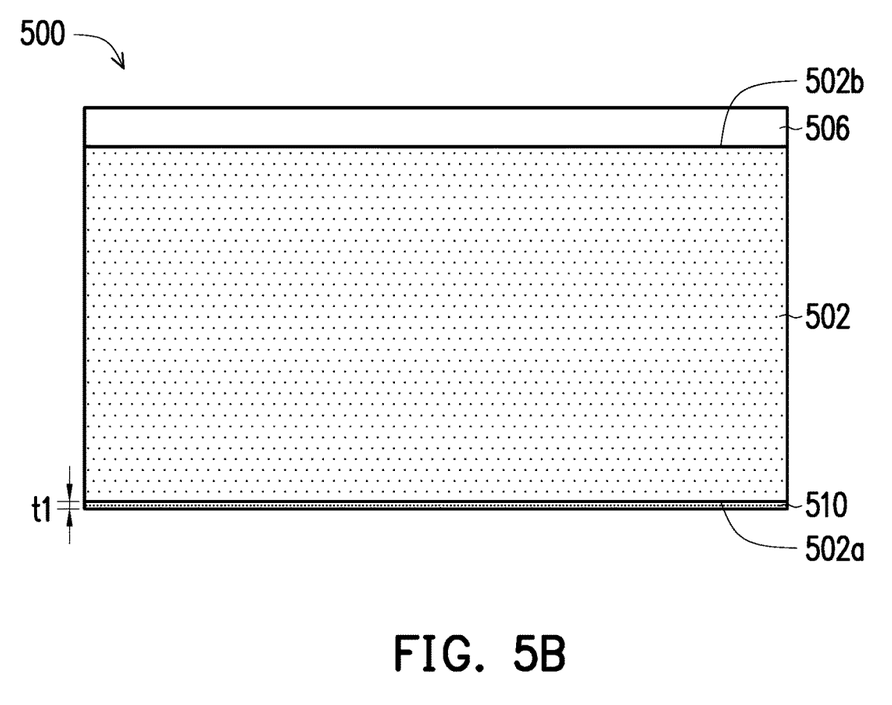
FIG. 5B is a schematic cross-sectional view of another semiconductor substrate of the fifth embodiment.

FIG. 5B is a schematic cross-sectional view of another semiconductor substrate of the fifth embodiment. The same or similar components are illustrated by the same numeral reference numbers as those in FIG. 5A. Refer to the relevant description of FIG. 5A for the description of the same or similar components, which is not iterated herein.

In FIG. 5B, the material layer in the semiconductor substrate 500 is a laser lift off (LLO) layer 510 disposed on the first surface 502a of the high-resistivity silicon carbide layer 502 and is in direct contact with the first surface 502a. The LLO layer 510 may be silicon carbide doped with aluminum. In one embodiment, the doping concentration of aluminum of the LLO layer 510 is greater than 1E20 cm$^{-3}$, for example, and the thickness t1 of the LLO layer 510 ranges from 1.0 nm to 10 nm, for example. The structure of FIG. 5B can be manufactured using the third embodiment.

Figure 5C:
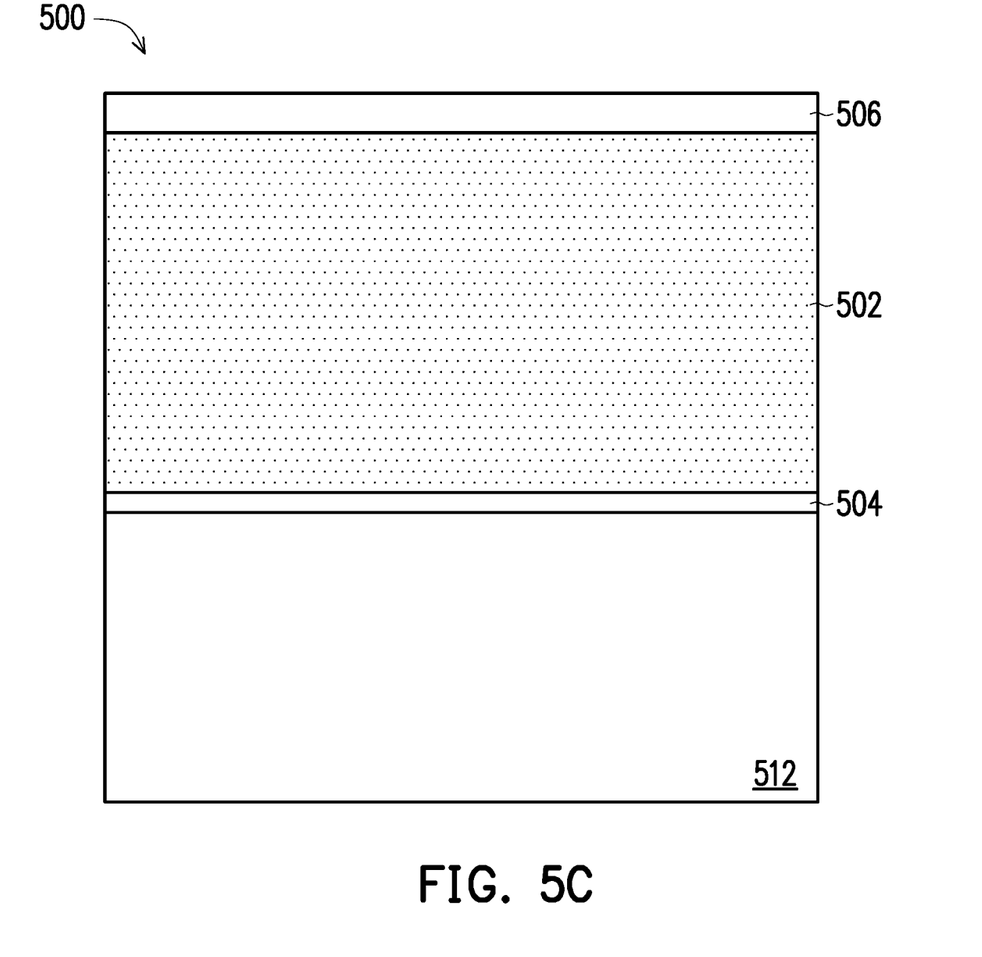
FIG. 5C is a schematic cross-sectional view of still another semiconductor substrate of the fifth embodiment.

FIG. 5C is a schematic cross-sectional view of still another semiconductor substrate of the fifth embodiment. The same or similar components are illustrated by the same numeral reference numbers as those in FIG. 5A. Refer to the relevant description of FIG. 5A for the description of the same or similar components, which is not iterated herein.

In FIG. 5C, the semiconductor substrate 500 may further include a supporting substrate 512 bonded to the exposed surface of the material layer 504 (the buffer layer). The supporting substrate 512 is a silicon substrate, a silicon-on-insulator (SOI) substrate, a ceramic substrate, or a glass substrate, for example.

Figure 6A:
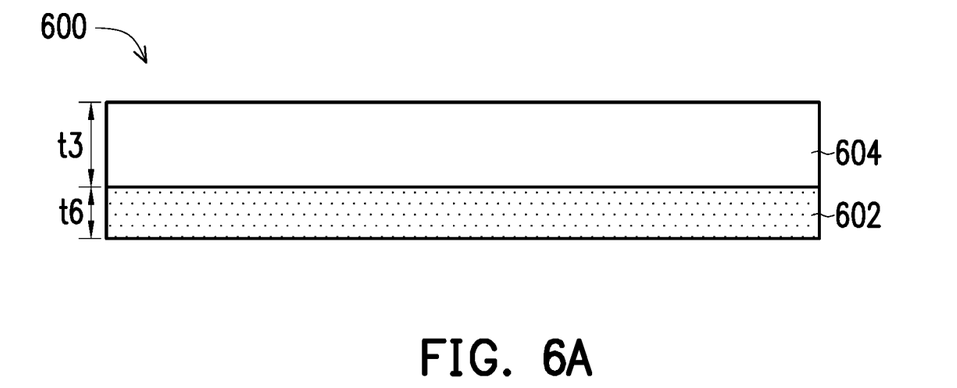
FIG. 6A is a schematic cross-sectional view of a semiconductor substrate according to a sixth embodiment of the disclosure.

FIG. 6A is a schematic cross-sectional view of a semiconductor substrate according to a sixth embodiment of the disclosure.

Referring to FIG. 6A, the semiconductor substrate 600 of the embodiment includes an N-type silicon carbide (N—SiC) layer 602 and a gallium nitride epitaxial layer 604 and accordingly is adapted for semiconductor substrates with power devices. The gallium nitride epitaxial layer 604 is formed on the surface of the N—SiC layer 602, the thickness t3 of the gallium nitride epitaxial layer 604 ranges from 0.3 µm to 6 µm, the structure of FIG. 6A can be manufactured with any method in the first embodiment to the fourth embodiment, and a step of removing left structures other than the N—SiC layer 602 can be added as required. After testing the obtained gallium nitride epitaxial layer 604, it is shown that the full width at half maximum (FWHM) of the X-ray diffraction analysis (002) plane is less than 100 arcsec. The thickness t6 of the N—SiC layer 602 ranges from 0.1 µm to 50 µm, and the surface of the N—SiC layer 602 has an angle ranging from 0° to +/−8° with respect to the (0001) plane, the micropipe density (MPD) of the N—SiC layer 602 is less than 0.5 ea/cm$^2$, the basal plane dislocation (BPD) of the N—SiC layer 602 is less than 10 ea/cm$^2$, and the threading screw dislocation (TSD) of the N—SiC layer 602 is less than 500 ea/cm$^2$. In an embodiment, the resistance of the N—SiC layer 602 ranges from 1E15 cm$^{-3}$ to 1E20 cm$^{-3}$, for example. The resistance variation rate of the N—SiC layer 602 is less than 5%.

Figure 6B:
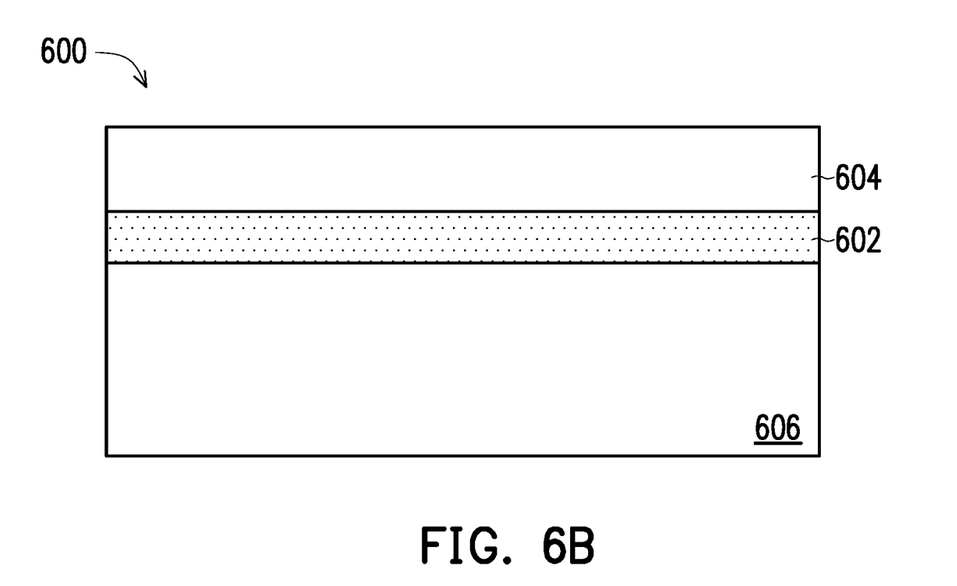
FIG. 6B is a schematic cross-sectional view of another semiconductor substrate of the sixth embodiment.

FIG. 6B is a schematic cross-sectional view of another semiconductor substrate of the sixth embodiment. The same or similar components are illustrated by the same numeral reference numbers as those in FIG. 6A. Refer to the relevant description of FIG. 6A for the description of the same or similar components, which is not iterated herein.

In FIG. 6B, the semiconductor substrate 600 may further include a supporting substrate 606 bonded to the exposed surface of the N—SiC layer 602. The supporting substrate 606 is a silicon substrate, a silicon-on-insulator (SOI) substrate, a ceramic substrate, or a glass substrate, for example.

Based on the above, in the disclosure, by the current epitaxial process, a silicon carbide layer, a buffer layer, and a gallium nitride epitaxial layer are sequentially epitaxially grown on a silicon carbide substrate. Moreover, along with a variety of methods for forming a damaged layer between the silicon carbide substrate and the silicon carbide layer, not only can gallium nitride with good crystallinity be grown, but also a majority of the silicon carbide substrate can be retained because of the existence of the damaged layer, so the silicon carbide substrate can be reused, and the substrate cost can be further reduced.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A semiconductor substrate, comprising:
   a high-resistivity silicon carbide layer comprising a first surface and a second surface opposite to the first surface; and
   a gallium nitride epitaxial layer formed on the second surface of the high-resistivity silicon carbide layer, wherein a thickness of the gallium nitride epitaxial layer is less than 2 µm, and a full width at half maximum (FWHM) of an X-ray diffraction analysis (002) plane is less than 100 arcsec, and
   a thickness of the high-resistivity silicon carbide layer ranges from 20 µm to 50 µm, the second surface of the high-resistivity silicon carbide layer has an angle ranging from 0° to +/−8° with respect to a (0001) plane, a micropipe density (MPD) of the high-resistivity silicon carbide layer is less than 0.5 ea/cm$^2$, basal plane dislocation (BPD) of the high-resistivity silicon carbide layer is less than 10 ea/cm$^2$, and threading screw dislocation (TSD) of the high-resistivity silicon carbide layer is less than 500 ea/cm$^2$.

2. The semiconductor substrate according to claim 1, wherein resistance of the high-resistivity silicon carbide layer is greater than 1E5 ohm-cm.

3. The semiconductor substrate according to claim 1, wherein a resistance variation rate of the high-resistivity silicon carbide layer is less than 50%.

4. The semiconductor substrate according to claim 1, further comprising a buffer layer, which is in direct contact with the first surface of the high-resistivity silicon carbide layer.

5. The semiconductor substrate according to claim 4, wherein a thickness of the buffer layer is less than 1.5 µm.

6. The semiconductor substrate according to claim 1, further comprising a laser lift off (LLO) layer, which is in direct contact with the first surface of the high-resistivity silicon carbide layer.

7. The semiconductor substrate according to claim 6, wherein the laser lift off (LLO) layer is silicon carbide doped with aluminum.

8. The semiconductor substrate according to claim 6, wherein a doping concentration of aluminum of the laser lift off (LLO) layer is greater than 1E20 cm$^{-3}$, and a thickness of the laser lift off (LLO) layer ranges from 1.0 nm to 10 nm.

9. The semiconductor substrate according to claim 1, further comprising a supporting substrate bonded to an exposed surface of the high-resistivity silicon carbide layer, wherein the supporting substrate comprises a silicon substrate, a silicon-on-insulator (SOI) substrate, a ceramic substrate, or a glass substrate.

10. A semiconductor substrate, comprising:
    an N-type silicon carbide (N—SiC) layer; and
    a gallium nitride epitaxial layer formed on a surface of the N-type silicon carbide (N—SiC) layer, wherein a thickness of the gallium nitride epitaxial layer ranges from 0.3 µm to 6 µm, and a full width at half maximum (FWHM) of an X-ray diffraction analysis (002) plane is less than 100 arcsec, and
    a thickness of the N-type silicon carbide (N—SiC) layer ranges from 0.1 µm to 50 µm, and the surface of the N-type silicon carbide (N—SiC) layer comprises an angle ranging from 0° to +/−8° with respect to a (0001) plane, a micropipe density (MPD) of the N-type silicon carbide (N—SiC) layer is less than 0.5 ea/cm$^2$, basal plane dislocation (BPD) of the N-type silicon carbide (N—SiC) layer is less than 10 ea/cm$^2$, and threading screw dislocation (TSD) of the N-type silicon carbide (N—SiC) layer is less than 500 ea/cm$^2$.

11. The semiconductor substrate according to claim 10, wherein resistance of the N-type silicon carbide (N—SiC) layer ranges from 1E15 cm$^{-3}$ to 1E20 cm$^{-3}$.

12. The semiconductor substrate according to claim 10, wherein resistance variation rate of the N-type silicon carbide (N—SiC) layer is less than 5%.

13. The semiconductor substrate according to claim 10, further comprising a supporting substrate bonded to an exposed surface of the N-type silicon carbide (N—SiC) layer, wherein the supporting substrate comprises a silicon substrate, a silicon-on-insulator (SOI) substrate, a ceramic substrate, or a glass substrate.

* * * * *